United States Patent

Gedcke et al.

[11] Patent Number: 6,028,543
[45] Date of Patent: Feb. 22, 2000

[54] APPARATUS FOR IMPROVEMENT OF THE SPEED OF CONVERGENCE TO SUB-LEAST-SIGNIFICANT-BIT ACCURACY AND PRECISION IN A DIGITAL SIGNAL AVERAGER AND METHOD OF USE

[75] Inventors: Dale A. Gedcke, Oak Ridge; Jeffrey V. Peck; Russell D. Bingham, both of Knoxville; Rex C. Trammell, Andersonville, all of Tenn.

[73] Assignee: EG&G Instruments, Inc., Wellesley, Mass.

[21] Appl. No.: 09/154,134

[22] Filed: Sep. 16, 1998

Related U.S. Application Data

[60] Provisional application No. 60/060,932, Oct. 3, 1997.

[51] Int. Cl.[7] .................................................. H03M 1/20
[52] U.S. Cl. .......................................... 341/131; 341/118
[58] Field of Search .................................. 341/118, 120, 341/131, 139, 144, 155

[56] References Cited

U.S. PATENT DOCUMENTS

| | | | |
|---|---|---|---|
| 3,622,765 | 11/1971 | Anderson | 702/199 |
| 4,034,367 | 7/1977 | Sugiyama et al. | 341/131 |
| 4,144,577 | 3/1979 | Ley | 341/131 |
| 4,393,372 | 7/1983 | Hoehn | 341/133 |
| 4,490,806 | 12/1984 | Enke et al. | 708/445 |
| 4,761,634 | 8/1988 | Yamaguchi et al. | 341/131 |
| 4,805,192 | 2/1989 | Confalonieri et al. | 375/342 |
| 4,866,442 | 9/1989 | Steim et al. | 341/143 |
| 4,947,168 | 8/1990 | Myers | 341/120 |
| 5,189,418 | 2/1993 | Bartz et al. | 341/118 |
| 5,493,298 | 2/1996 | Bartz | 341/118 |
| 5,825,318 | 10/1998 | Patapoutian et al. | 341/131 |

OTHER PUBLICATIONS

C. Cottini, E. Gatti, and V. Svelto—A New Method for Analog to Digital Conversion—Letters to the Editor, Nuclear Instruments and Methods, 24 (1963), pp. 241–242, North–Holland Pubishing Co.

*Primary Examiner*—Howard L. Williams
*Assistant Examiner*—Peguy JeanPierre
*Attorney, Agent, or Firm*—Pitts & Brittian, P.C.

[57] ABSTRACT

A method for improving the speed of convergence to sub-least-significant-bit accuracy and precision in a digital signal averager when the measurements are averaged over many samples where the noise inherent in the signal is not large compared to 1 LSB. A slider offset circuit implements the method which adds offsets to an analog input signal acquired from an analog sensor. The slider offset circuit compensates for limitations in the resolution of an analog-to-digital converter by adding a sub-least-significant-bit offset to the input signal. Similarly, the slider offset circuit compensates for the differential non-linearity using a Gatti offset which are whole number multiples of the average voltage bin width. Speed of convergence to sub-LSB accuracy is further improved by employing non-consecutive increments in the two sliders.

14 Claims, 8 Drawing Sheets

APPARATUS FOR IMPROVEMENT OF THE SPEED OF CONVERGENCE TO SUB-LEAST-SIGNIFICANT-BIT ACCURACY AND PRECISION IN A DIGITAL SIGNAL AVERAGER AND METHOD OF USE

This application claims the benefit of U.S. Provisional Application Ser. No. 60/060932, filed Oct. 3, 1997.

TECHNICAL FIELD

This invention relates to the measurement of rapidly changing, repetitive electronic waveforms. More specifically, the present invention relates to a method for improving the speed of convergence to sub-least-significant-bit precision and accuracy for instruments in which such waveforms are digitized by high-speed analog-to-digital converters and wherein repeated measurements are averaged to improve the signal-to-noise ratio and the dynamic range.

BACKGROUND ART

It is well known that in many scientific fields, a physical quantity of interest appears in the form of a time-varying voltage. Such signals may be observed on an oscilloscope or digitized and recorded with a computer for analysis and display. If the signal is repetitive with respect to some time, it may be advantageous to digitize and average the signal over several records. Each record is initiated by a trigger that is synchronized to the same time or phase in the repetitive signal. During each record the voltage waveform is sampled at periodic time intervals and the samples are digitized and stored in memory. Because the time spans and sampling intervals are identical for each record, the data from each record can be added to the sum of the previous records and the final result divided by the number of records to form the average. Such averaging can improve the signal-to-noise ratio. A measurement instrument particularly well suited for rapidly varying signals is a digital signal averager (DSA).

The digitization of the voltage signal at the input to the DSA is accomplished by an analog-to-digital converter (ADC). The digital resolution is determined by the number of bits in the ADC, and the minimum voltage quantization interval is the width of one least-significant-bit (LSB).

It is well known by those skilled in the art that the signal-to-noise ratio of the averaged signal improves in proportion to the square root of the number of records that are averaged, provided the noise is not time-correlated with the trigger. If the noise on the signal is less than 1 LSB of the ADC, then the accuracy of the averaged signal is limited by the size of 1 LSB.

The following example helps to explain the limitation on accuracy caused by the digital resolution of the ADC. A DSA designed for recording fast signals might have an input ADC capable of sampling at two (2) nanosecond intervals with a resolution of eight bits (256 discrete levels). For the convenience of calculation, assume that the eight bits of the ADC cover an input voltage range from 0 to 2.55 volts with the ADC output code 0 centered on zero volts and the output code 255 centered on 2.55 volts. Accordingly, the ADC output is some multiple of 0.01 volts. Therefore, if the analog signal amplitude at some particular time relative to the trigger is always 1.004 volts, the ADC will always record 1.00 volts when it samples that point in the waveform. Consequently, the waveform reconstructed from the ADC samples will not have a smooth, continuous shape, but will increase or decrease in abrupt steps of 0.01 volt. Relevant details of the waveform which are smaller than the 0.01 volt resolution of the ADC will be lost. The change in voltage corresponding to the change of the least-significant-bit of the ADC (0.01 volts in this example) is often termed the voltage bin width.

FIGS. 1 and 2 illustrate the loss of detail associated with the voltage bin width. FIG. 1 shows an analog input signal to the ADC. This signal meanders within the limits of two bins defined by the LSB boundaries at 1.005, 1.015, and 1.025 volts. The center of the lower bin is at 1.01 volts, and samples within this bin always generate the ADC code 101. The upper bin is centered at 1.02 volts, and samples within this bin always yield the ADC code 102. In this example, the ADC samples the analog input voltage at 2-nanosecond intervals, as denoted by the dots in FIGS. 1 and 2. FIG. 2 shows the digital output of the ADC resulting from the sampling of the analog voltage in FIG. 1. Dividing the ADC code by 100 expresses the digital output in terms of the input voltage. Clearly, the voltage variation details that fell within 1 LSB at the ADC input are lost in the digital output of the ADC.

Those skilled in the art will recognize that a standard solution to the limitations caused by the finite bin width involves the addition of noise to the signal, as illustrated in FIG. 3. In this example, the instantaneous input voltage at the sampling time is 1.008 volts. This falls within the amplitude bin defined by ADC code 101, which has bin boundaries at 1.005 volts and 1.015 volts. In the absence of added noise, this signal would be reported by the ADC as code 101, which represents a 1.010 input voltage. To achieve a more accurate measurement of the voltage, noise is artificially added to the signal. There are two critical requirements for the added noise. First, the noise must be random with respect to the trigger and the signal. Second, the noise must have a zero mean voltage. In this example, the noise has a uniform or flat distribution of amplitudes, as defined in FIG. 4. In this case, the width of the noise distribution, W, is set equal to the width of 1 LSB in the ADC. When the signal plus noise is sampled a large number of times, 80% of the samples will yield ADC code 101, and 20% of the samples will generate ADC code 100. Consequently, the average code will be:

$$(0.80 \times 101) + (0.20 \times 100) = 100.8 \qquad (1)$$

which represents an input voltage of 1.008 volts.

While useful for explaining the theory, the flat noise distribution in FIG. 4 is impractical to implement. Prior art devices typically use the convenient Gaussian noise distribution depicted in FIG. 5. The root-mean-square (rms) noise voltage for this distribution has a value denoted by σ, and the Full Width at Half Maximum (FWHM) is given by:

$$\text{FWHM} = 2.35\sigma \qquad (2)$$

The typical distribution of Gaussian noise used in prior art devices is random with respect to the trigger and the signal to be digitized. Furthermore, it has a zero mean and a uniform power density versus frequency. Hereinafter, Gaussian noise having these characteristics will be referred to as "white Gaussian noise".

Because the Gaussian curve does not have a linear distribution, it is not necessarily obvious that replacing the flat noise distribution with white Gaussian noise will result in a measurement of the input voltage that is linearly accurate to a small fraction of 1 LSB. However, by calculating the maximum systematic error caused by the Gaussian noise in measuring the input voltage after averaging many samples, the linear accuracy can be proven. The maximum systematic error, Δ, occurs when the original signal (and the mean of the noise distribution) is half-way between the center and the edge of a voltage bin. As shown in FIG. 6, the systematic error becomes a negligible fraction of 1 LSB, when the rms voltage of the white Gaussian noise is greater than 0.6 LSB. To provide a margin of safety, σ≧1 LSB is typically chosen for the noise amplitude. Under these conditions, the white Gaussian noise provides essentially the same quality of interpolation below 1 LSB in the averaged signal as is afforded by the flat noise distribution.

However, the example employing white Gaussian noise readily demonstrates how this traditional solution limits the speed of convergence to a precise answer. The added noise causes a random error in each sample of the input signal which can be reduced by averaging the data. The number of samples which must be averaged to achieve a desired precision in the measured voltage can be calculated as the square of the product of FWHM of the Gaussian noise and the inverse of the fraction of one LSB representing the desired precision. For example, where the FWHM of the Gaussian noise is two (2) LSB, to achieve a precision of 1/16 LSB in the measured voltage $(2 \times 16)^2$, or 1024, samples must be averaged.

The discussion to this point has presumed an ADC with voltage bin widths which are perfectly uniform over the entire measurement range. This corresponds to zero differential non-linearity (DNL). However, a practical ADC has a finite differential non-linearity specification such as ±½ LSB. Taking the exemplary eight-bit ADC having an input voltage range of 0 to 2.55 volts, the voltage bin width is not a constant 0.01 volts, but can vary from 0.005 to 0.015 volts over the ADC range. To aid in understanding the errors caused by differential non-linearity, apply the earlier example of a uniform noise distribution to the case in FIG. 7. In FIG. 7, the voltage bin width for ADC code 101 is only 0.005 volts, while the width for code 100 is 0.015 volts. When the input signal plus the flat noise is sampled many times, 30% of the samples yield the 101 code and 70% of the samples return the 100 code. Thus, the computed average voltage for the input signal is:

$$(0.30 \times 101) + (0.70 \times 100) = 100.3 \tag{3}$$

which represents an input voltage of 1.003 volts. This result is in error of 0.005 volts in reference to the true value of 1.008 volts. The differential non-linearity has caused a 0.005-volt inaccuracy in the measurement. This underlying systematic error is independent of the number of samples averaged.

One method for correcting the differential non-linearity error is to trade some of the useful range of the ADC for a decrease in the systemic error attributable to the DNL. For example, by broadening the width of the flat noise distribution until it spans approximately 16 times the average width of 1 LSB, the added noise will average the measurement over 16 adjacent voltage bins. This reduces the differential non-linearity error by approximately a factor of 16 while giving up 16/256 or 6.25% of the useful ADC range. Systematic error from DNL becomes ±½ LSB×1/16, or ±1/32 LSB, after averaging many samples. Further improvement can be gained by using an even wider noise distribution with a corresponding reduction in the useful range of the ADC.

The uniform noise distribution in the previous paragraph has an rms voltage given by:

$$\sigma = \frac{W}{2\sqrt{3}} = \frac{16}{2\sqrt{3}} = 4.6 \text{ LSB} \tag{4}$$

Consequently, the same functionality could be achieved by replacing the uniform noise with white Gaussian noise having the same value of σ, i.e., 4.6 LSB. This corresponds to an FWHM of 10.8 LSB for the Gaussian distribution. Such a solution raises a serious problem. Adding the Gaussian noise causes a random error of 10.8 LSB (FWHM) in a single sample of the voltage. To reduce this error to 1/16 LSB requires averaging $(10.8 \times 16)^2 = 29,860$ samples of the input signal. Clearly, the rate of convergence to a precision and accuracy of 1/16 LSB is extremely slow with the prior art method of adding noise.

Another solution to the DNL error problem was solved by Gatti et al. for the field of pulse height analysis (C. Cottini, E. Gatti, and V. Svelto, Nucl. Instr. and Meth. 24 (1963) 241). Gatti employed a circuit generating offsets which incremented by the average bin width of one LSB, known as a Gatti slider. Although not originally designed for use in a digital signal averager, the Gatti slider concept can be modified and advantageously applied to a digital signal averager as follows. The result is a more efficient method for reducing differential non-linearity. A series of measurements are taken where the analog input signal is slid across a predetermined number of average bin widths by adding an analog voltage offset to the input signal. The analog voltage offset corresponds to a whole number multiple of the average voltage bin width and is incremented with each record. The summed analog signal is digitized and the results are averaged. Accordingly, the error introduced as a result of the differential non-linearity of the voltage bin width is reduced by the factor corresponding to the number of voltage bins across which the summed analog signal is averaged.

Other devices have been previously disclosed. Typical of the art are those devices disclosed in the following U.S. patents:

| U.S Pat. No. | Inventor(s) | Issue Date |
| --- | --- | --- |
| 4,490,806 | Enke et al. | Dec. 25, 1984 |
| 4,393,372 | W. Hoehn | Jul. 12, 1983 |
| 4,144,577 | G. Ley | Mar. 13, 1979 |
| 3,622,765 | W. Anderson | Nov. 23, 1971 |

The U.S. Pat. No. 4,490,806 discloses a high speed data acquisition which includes a noise source for improving the dynamic range in the summed time spectra. The amplitude of the added noise is at least as large as one LSB of the ADC.

The U.S. Pat. No. 3,622,765 discloses a means for adding sub-LSB (SLSB) analog increments to the analog signal before digitizing in the ADC. The resulting digital waveforms are summed or averaged over repeated scans. The analog increments are derived from a repetitive, continuous, incremental waveform, producing N discrete increments. The '765 device does not compensate for the differential non-linearity of the ADC. Furthermore, the '765 device does not disclose a method of adding discrete, non-linear increments for reducing the error when averaging a number of records which is less than N.

The U.S. Pat. No. 4,144,577 discloses a device employing the method described in the '765 patent. The interpolation step size is intended to be less than one LSB of the ADC. As with the '765 device, no compensation is made for the differential non-linearity of the ADC. Similarly, the '577 patent does not teach a device which permits the addition of discrete, non-linear increments for error reduction when sampling less than the optimum number of samples, N.

The U.S. Pat. No. 4,393,372 discloses a device for increasing the number of bits by one in a flash ADC encoding an analog signal. The method adds +½ LSB and −½ LSB of analog voltage to the input signal on alternate samples of the input signal. The '372 device embodied in discrete components is not designed for interpolating to less than ½ LSB. Furthermore, the '372 device does not compensate for the differential non-linearity of the ADC.

The '806, '372, '577, and '765 prior art devices do not correct for errors introduced by the differential non-linearity of the ADC. As a result, the prior art devices do not work accurately for all ADC codes. Additionally, the '372, '577, and '765 prior art devices disclose only the addition of linear increments or increments derived from a digital waveform of alternating polarity. Such a practice causes deterioration of accuracy when the number of records obtained is not a whole-number multiple of the number of increments in the complete set of increments.

Thus, it is an object of the present invention to provide a method for improving the accuracy of an averaged signal when the noise inherent in the signal is not large compared to 1 LSB, and to converge to the desired level of accuracy more rapidly than is possible with prior art.

Another object of the present invention is to provide a method for reducing the differential non-linearity of the ADC so that the interpolation to a fraction of 1 LSB is accurate for all ADC codes.

A still further object of the present invention is to provide a method for producing results which are more precise and more accurate in a given measurement time than is possible with the noise-adding prior art, and wherein a means is provided to obtain a faster solution for interpolating to a fraction of 1 LSB, and a faster solution for reducing the error caused by the differential non-linearity of the ADC in the DSA.

Yet another object of the present invention is to provide a method wherein non-linear increments can be utilized to permit greater accuracy when the number of records obtained does not permit the complete set of increments to be employed.

DISCLOSURE OF THE INVENTION

Other objects and advantages will be accomplished by the present invention which serves to provide a method for improving the accuracy of an averaged signal when the noise inherent in the signal is not large compared to 1 LSB. Furthermore, the present invention provides a method for converging to the desired level of accuracy more rapidly than is possible with prior art.

The slider offset circuit described below is designed to compensate for limitations in the voltage bin width and the differential non-linearity inherent in a conventional analog-to-digital converter (ADC) when the measurements are averaged over many samples. By adding the analog offset generated by the slider offset circuit to the analog signal provided at the analog input, the error introduced during the digitization process can be minimized.

The analog input signal is obtained from a conventional analog sensor used for obtaining measurement from a sample. The analog sensor measures a voltage waveform that is repetitive with respect to some trigger event. The measured section of the waveform covers some arbitrary time interval, termed a scan, and the measurement, termed a record, is averaged over some arbitrary number of scans.

Because of the limitations of a conventional ADC with respect to resolution and differential non-linearity, the analog signal obtained from the analog sensor must be conditioned. Conditioning is achieved using a sub-least-significant-bit (SLSB) slider and a Gatti slider. The sliders incorporate at least one digital-to-analog converter (DAC) for generating an analog offset to be added to the analog input signal. Specifically, the SLSB slider generates an analog offset which is a fraction of one least-significant-bit (LSB) of the analog-to-digital converter for improving the effective resolution of the ADC. The Gatti slider generates an analog offset nominally equal to the average bin width of one LSB of the ADC to compensate for variations in the voltage bin width of the ADC. A clock and control unit (CCU) generates timing signals for sequencing the slider offset circuit and generates the digital values representing the offsets. The analog signal from the detector is summed with the analog offsets from the SLSB slider and the Gatti slider by a summing circuit. An ADC digitizes the summed analog signal. The offsets added by the sliders are held constant throughout each scan and are changed at the end of each scan.

A slider offset subtraction device removes the offsets introduced by the SLSB slider and the Gatti slider from the digital signal to restore the integrity of the data. Subtraction of the digital representation of the analog offset can occur either before or after summing and averaging, and can be skipped where the d.c. offset of the signal is of no interest, or where the mean of the added offsets is approximately zero for the averaged number of records.

A processor sums the result of the data acquisition of the current record with the previous sum from previous records read from data memory and stores the new sum in data memory. At the conclusion of data acquisition, the sum of the records, termed a spectrum, is transferred to an analysis and storage device, optionally being conditioned by a digital signal processor.

The incremental offset generated by the SLSB slider comprises a set of fractions having a common denominator, D, and numerators which differ from each other by the integer value one (1). The number of fractions in the set is equal to the value of the denominator. The values of the fractions range from zero (0) to $$\frac{D-1}{D}$$

multiplied by the voltage corresponding to the average width of 1 LSB of the ADC. For each record, one member of the set of fractions is added to the analog input signal recorded from the analog sensor. When all members of the set have been selected, the offset cycle repeats. Because the offset voltage changes only at the end of a record, ample time is available to provide the stable, low-noise offset required. Furthermore, because the amount of the analog offset voltage to be added at the input is predetermined, the digital representation of that offset is known and can be subtracted from the output of the ADC.

Accordingly, the SLSB slider provides an increasingly accurate output from the ADC as more data is averaged. Further, the result will be obtained in significantly fewer samples than with prior art devices. Of course, the time resolution of the SLSB slider method is still the sampling interval of the ADC used, so fast waveforms are recorded with the same time resolution.

Because the voltage bin width for each LSB is not uniform over the full range of the ADC, a Gatti slider must be used to reduce the effective differential non-linearity of a conventional ADC to less than ±⅒ LSB in order for the SLSB slider to function properly. The Gatti slider generates offsets which are a multiple of the average bin width of one LSB. After cycling through the complement of Gatti slider offsets, the Gatti cycle is repeated. By "sliding" a given measurement over several adjacent bins, the DNL becomes the average of the DNL of those bins.

Accordingly, a method exists by combining the SLSB slider and the Gatti slider with a digital signal averager to provide an instrument with an improved speed of convergence to sub-least-significant-bit accuracy and precision. As will be demonstrated in the description of a preferred embodiment, the speed of convergence is improved by using predetermined, non-consecutive fractions for the increments.

BRIEF DESCRIPTION OF THE DRAWINGS

The above mentioned features of the invention will become more clearly understood from the following detailed description of the invention read together with the drawings in which.

BEST MODE FOR CARRYING OUT THE INVENTION

The slider offset circuit of the present invention is shown generally at 10 in the figures. The slider offset circuit 10 is designed to compensate for limitations in the voltage bin width and the differential non-linearity inherent in a conventional analog-to-digital converter (ADC) 28 when the measurements are averaged over many samples. By adding the analog offset generated by the slider offset circuit 10 to the analog signal measured by an analog sensor 20, the error introduced during the digitization process can be minimized.

Figure 8:
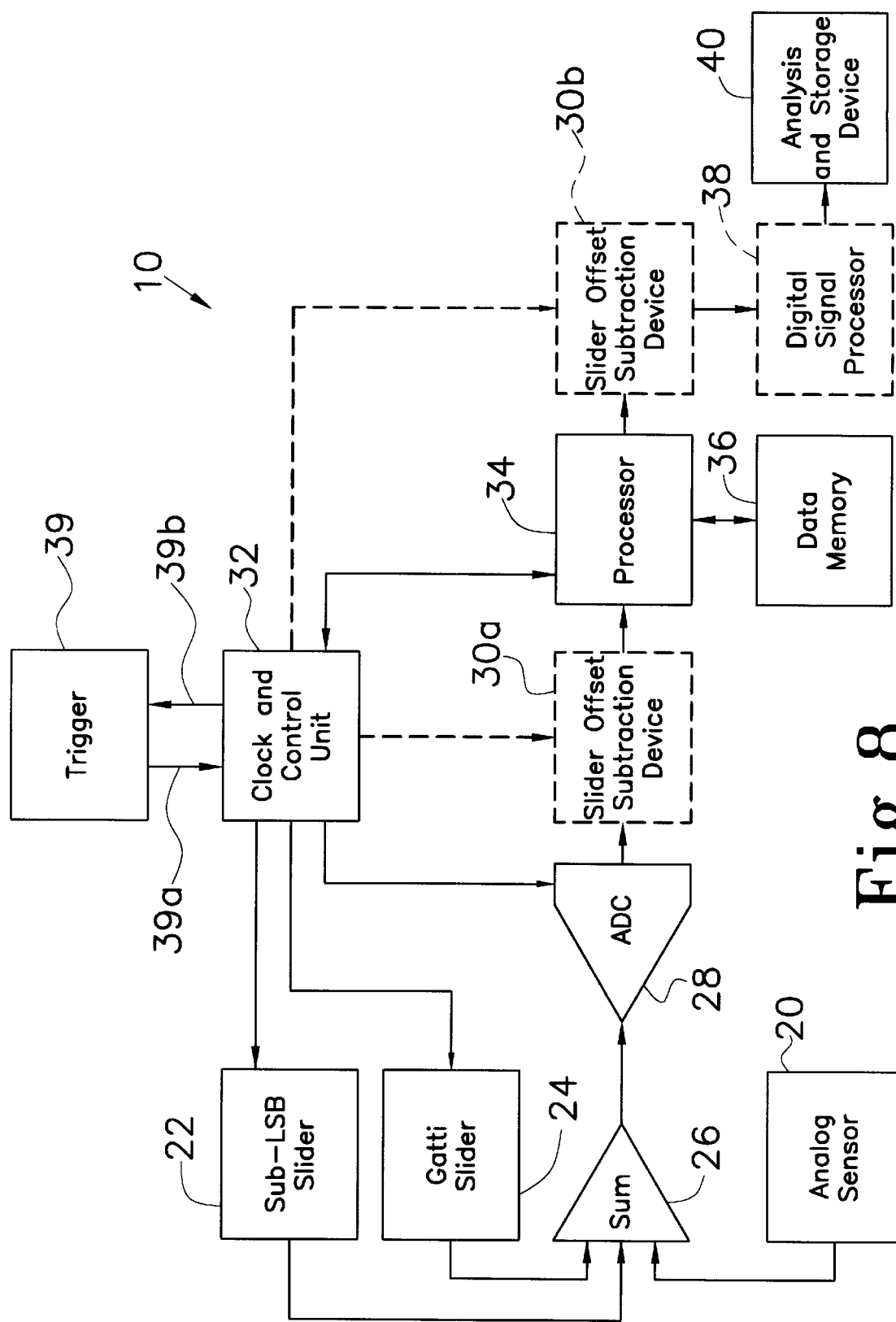
FIG. 8 is a block diagram of the slider offset circuit incorporating various features of the present invention.

FIG. 8 illustrates a block diagram of the slider offset circuit. A conventional analog sensor 20 used for obtaining measurement from a physical or chemical process provides an analog input signal. The analog sensor 20 produces a voltage waveform that is repetitive with respect to some trigger event 39, which is synchronized with either the trigger input 39a or the trigger output 39b. The measured section of the waveform covers some arbitrary time interval, termed a scan, and the measurement, termed a record, is averaged over some arbitrary number of scans. One skilled in the art will recognize that any analog sensor 20 can be used, however, devices from which the results are typically averaged are best suited for use with the present invention. In the illustrated embodiment, the analog sensor 20 is a time-of-flight mass spectrometer.

Because of the limitations of a conventional ADC 28 with respect to resolution and differential non-linearity, the analog signal obtained from the analog sensor 20 must be conditioned. Conditioning is achieved using a sub-least-significant-bit (SLSB) slider 22 and a Gatti slider 24. Specifically, the SLSB slider 22 generates an analog offset which is a fraction of one least-significant-bit (LSB) of the analog-to-digital converter 28 for the purpose of improving the effective resolution of the ADC 28. The Gatti slider 24 generates an analog offset with a minimum increment nominally equal to the average bin width of one LSB of the ADC 28 to compensate for variations in the voltage bin width of the ADC 28. One skilled in the art will recognize that the SLSB slider 22 and the Gatti slider 24 can be implemented in various ways. In the illustrated embodiment, each slider includes a separate digital-to-analog converter (DAC). Other implementations can be used such as combining the two sliders into one common DAC. A clock and control unit (CCU) 32 generates timing signals for sequencing the slider offset circuit 10 and generates the digital values representing the offsets. Each of the SLSB slider 22 and the Gatti slider 24 converts the digital values to an analog offset. The analog signal from the detector 20 is summed with the analog offsets from the SLSB slider 22 and the Gatti slider 24 by a summing circuit such as a summing amplifier 26. An ADC 28 digitizes the summed analog signal.

A slider offset subtraction device 30 removes the offsets introduced by the SLSB slider 22 and the Gatti slider 24 from the digital signal to restore the integrity of the data. Subtraction of the digital representation of the analog offset added by the SLSB slider 22 and the Gatti slider 24 is accomplished in a variety of ways. In the preferred embodiment, the digital representation of the net effect of the slider offsets is subtracted in slider offset subtraction device 30b after data collection has been completed for the desired number of scans. Alternatively, the digital representation of the analog offsets is subtracted from each ADC output value in slider offset subtraction device 30a. This solution requires broadening the digital bus at the output of the ADC in order to accommodate the lower order bits contributed by the SLSB slider 22. Another alternative method symmetrically steps both sliders either incrementally or decrementally of alternating polarity about the mean. In this case the residual d.c. offset caused by the sliders can be negligible when a large number of scans are averaged. Finally, there are a few applications where the d.c. offset of the signal is of no interest, where only the AC variations of the signal are important. In such cases it is not necessary to subtract the digital representation of the slider offsets, because the offsets show up as a d.c. offset of the averaged waveform.

A processor 34 sums the result of the data acquisition of the current record with the previous sum from previous records read from data memory 36 and stores the new sum in data memory 36. At the conclusion of data acquisition, the sum of the records, termed a spectrum, is transferred to an analysis and storage device 40, such as a conventional computer. The amplitude scale in the spectrum can be related to the sampled voltage by a variety of methods including calibration and dividing by the number of scans. One skilled in the art will recognize that the spectrum can be conditioned using a digital signal processor 38; however, one skilled in the art will recognize that other conditioning or no conditioning could be used.

Figure 1:
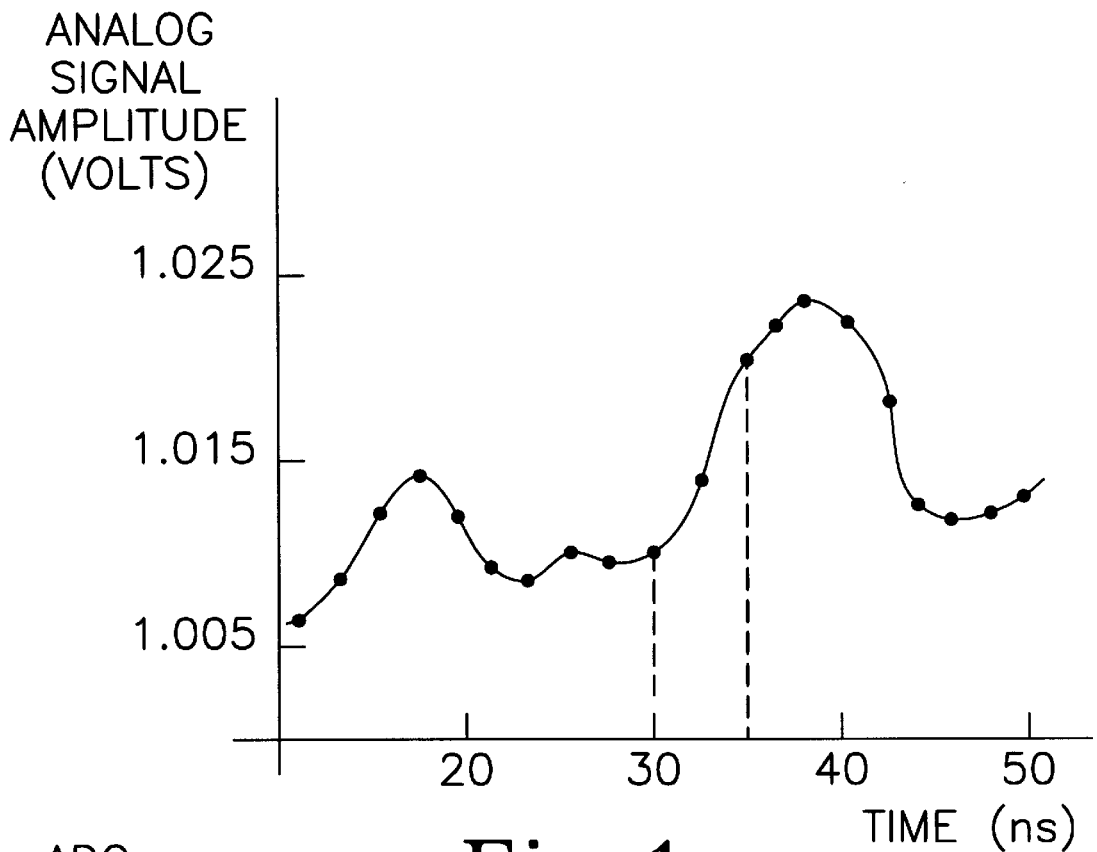
FIG. 1 illustrates a small interval of a single scan of a digital signal averager (DSA), wherein each data point on the waveform denotes an analog-to-digital converter (ADC) sample, at 2-nanosecond intervals, the vertical axis being divided into the voltage bin widths of the ADC, the signal having details of interest as small as one tenth the voltage bin width and changing significantly in times on the order of a few nanoseconds.
Figure 2:
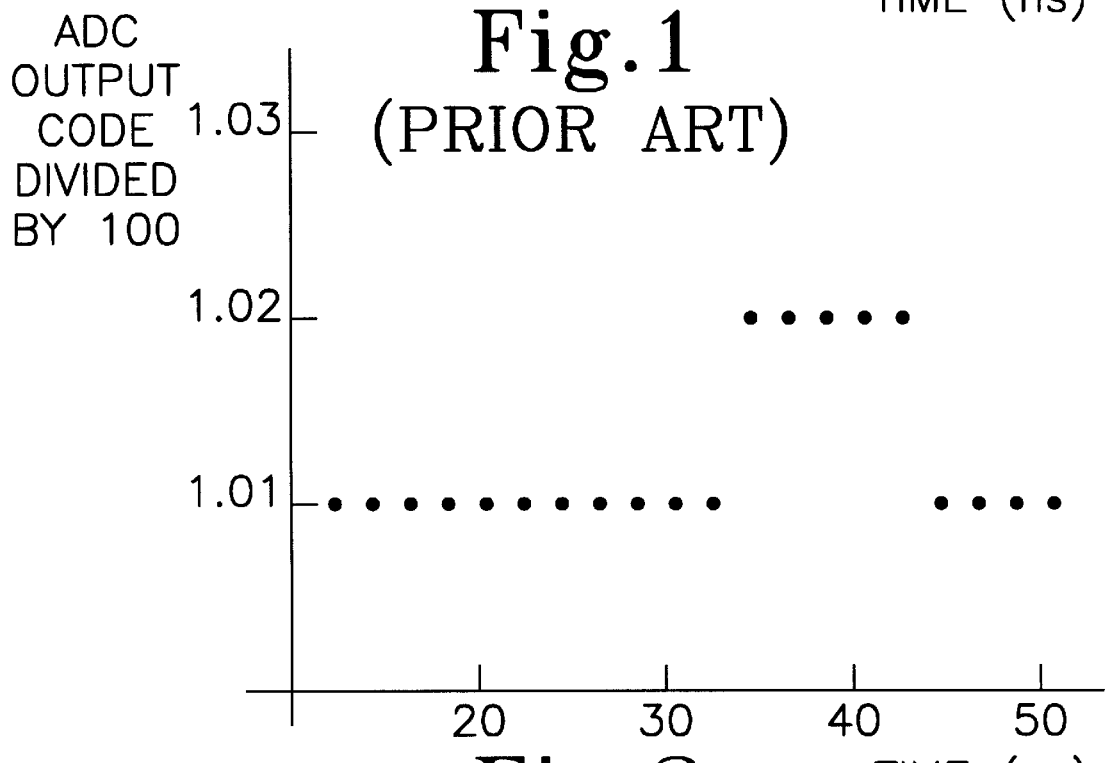
FIG. 2 illustrates the result of digitizing the signal of FIG. 1.
Figure 3:
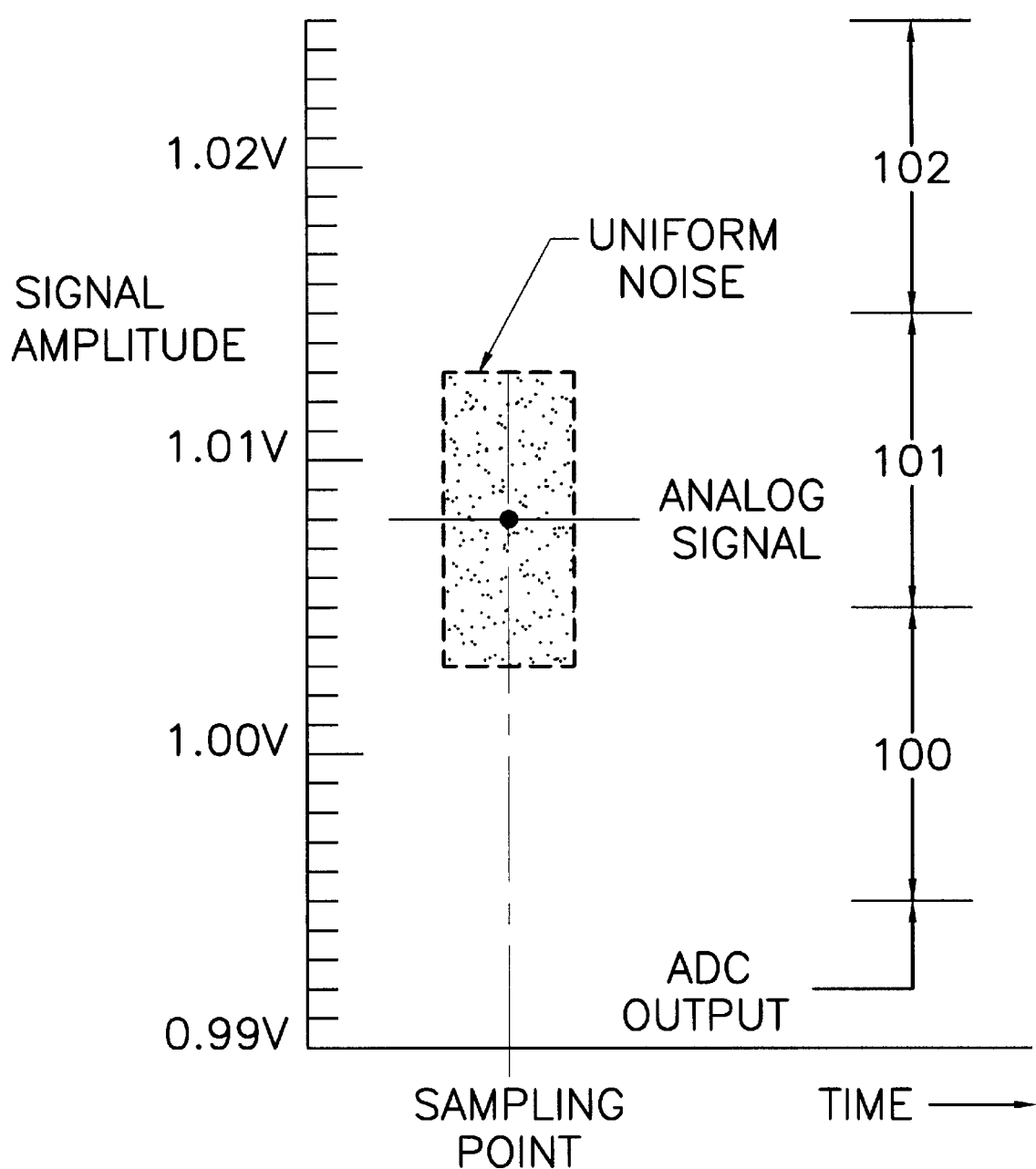
FIG. 3 illustrates the method of interpolation by adding 1 LSB of flat noise to an ADC with zero differential non-linearity, and focusing specifically on an ADC sample of the analog signal at one particular time, the input signal voltage being displayed at the left on the vertical axis, while the ADC output code is noted at the right side.
Figure 4:
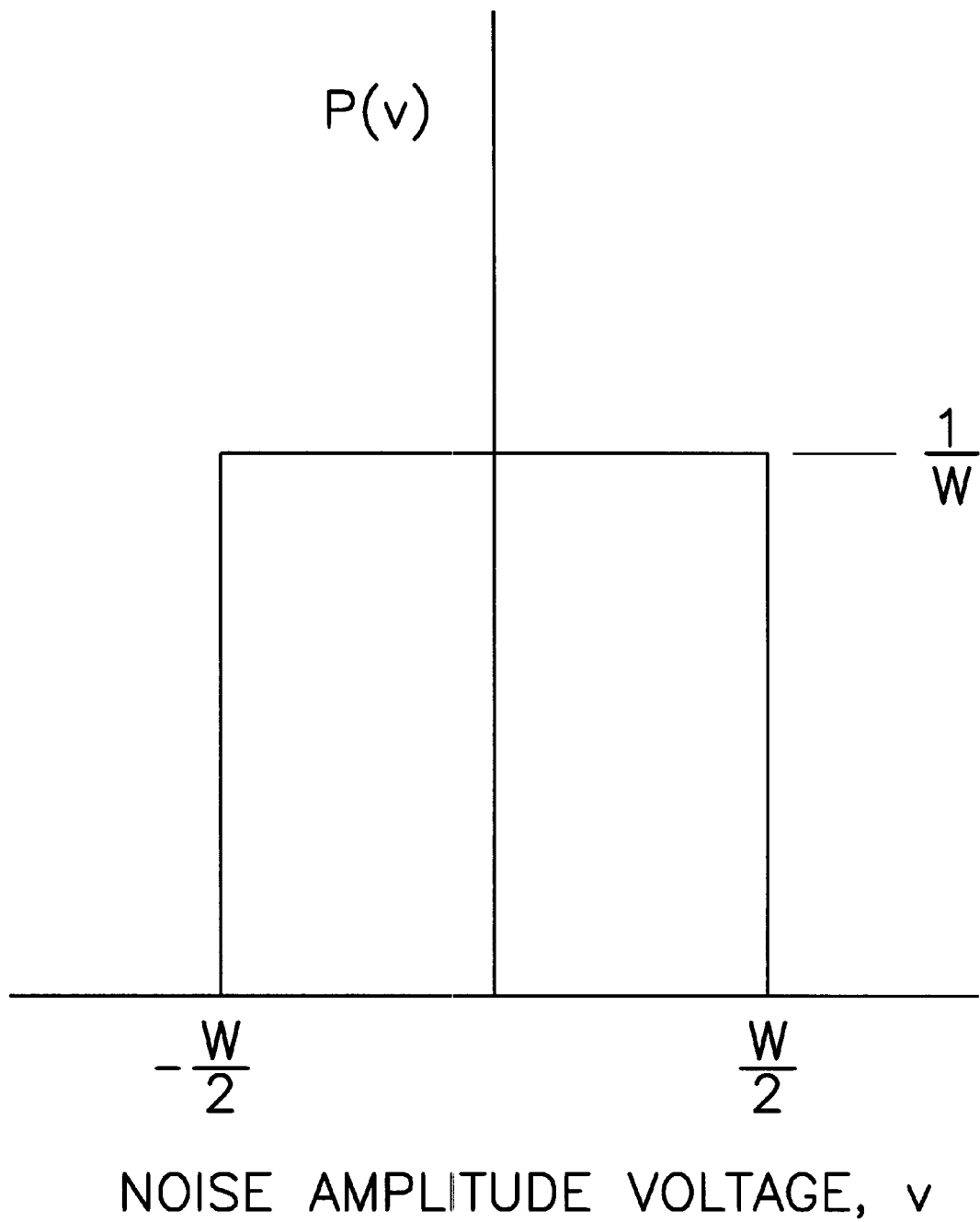
FIG. 4 illustrates the shape of the uniform (or flat) noise distribution where P(v) is the probability of observing a voltage, v, from the noise source at any time, the distribution having a zero mean, a voltage width, W, and an rms voltage of $$\frac{W}{2\sqrt{3}};$$
Figure 5:
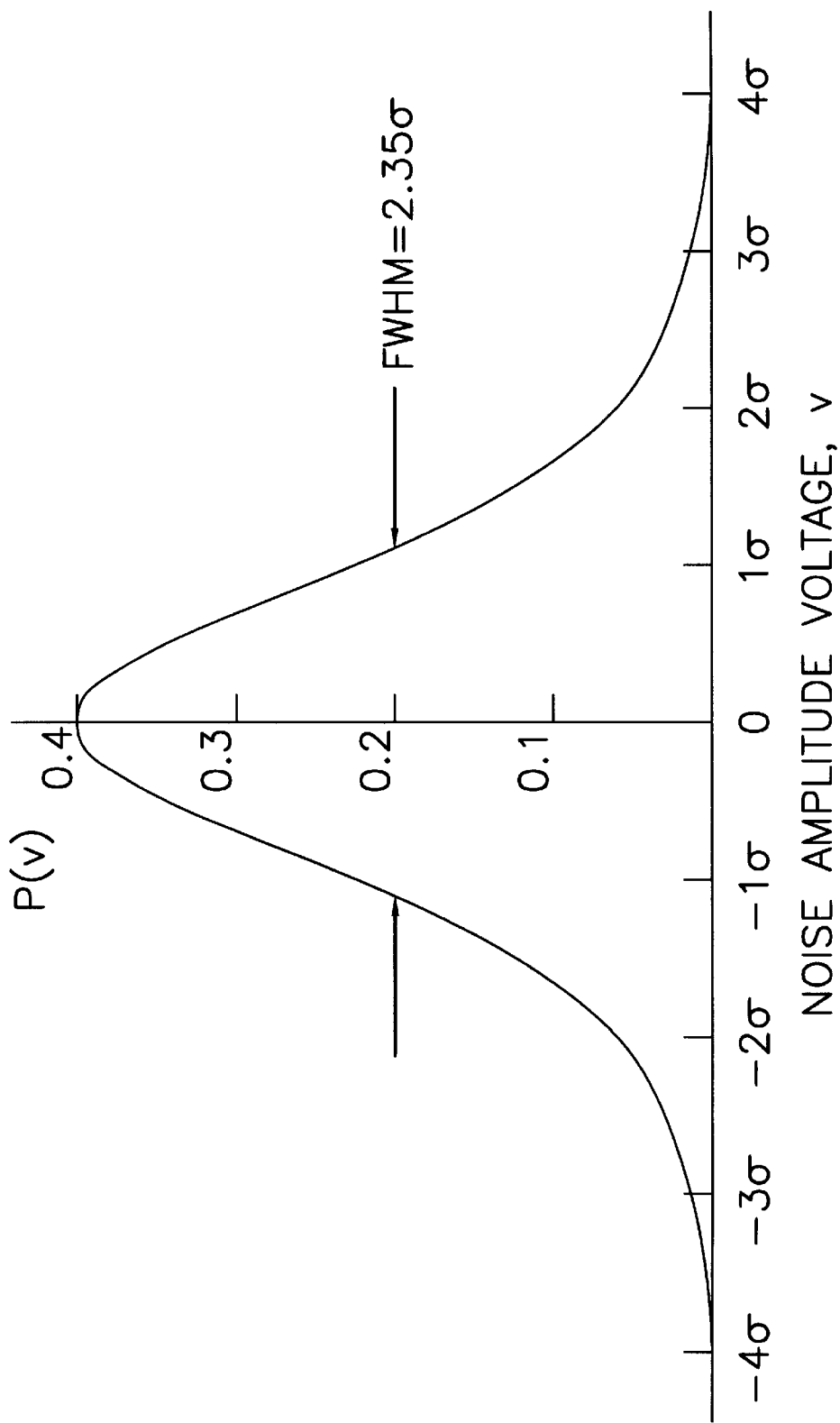
FIG. 5 illustrates the shape of the Gaussian noise distribution, P(v) being the probability of observing a voltage, v, from the noise source at any time, with a zero mean and an rms voltage denoted by σ, the Full Width at Half Maximum (FWHM) being 2.35 σ.
Figure 6:
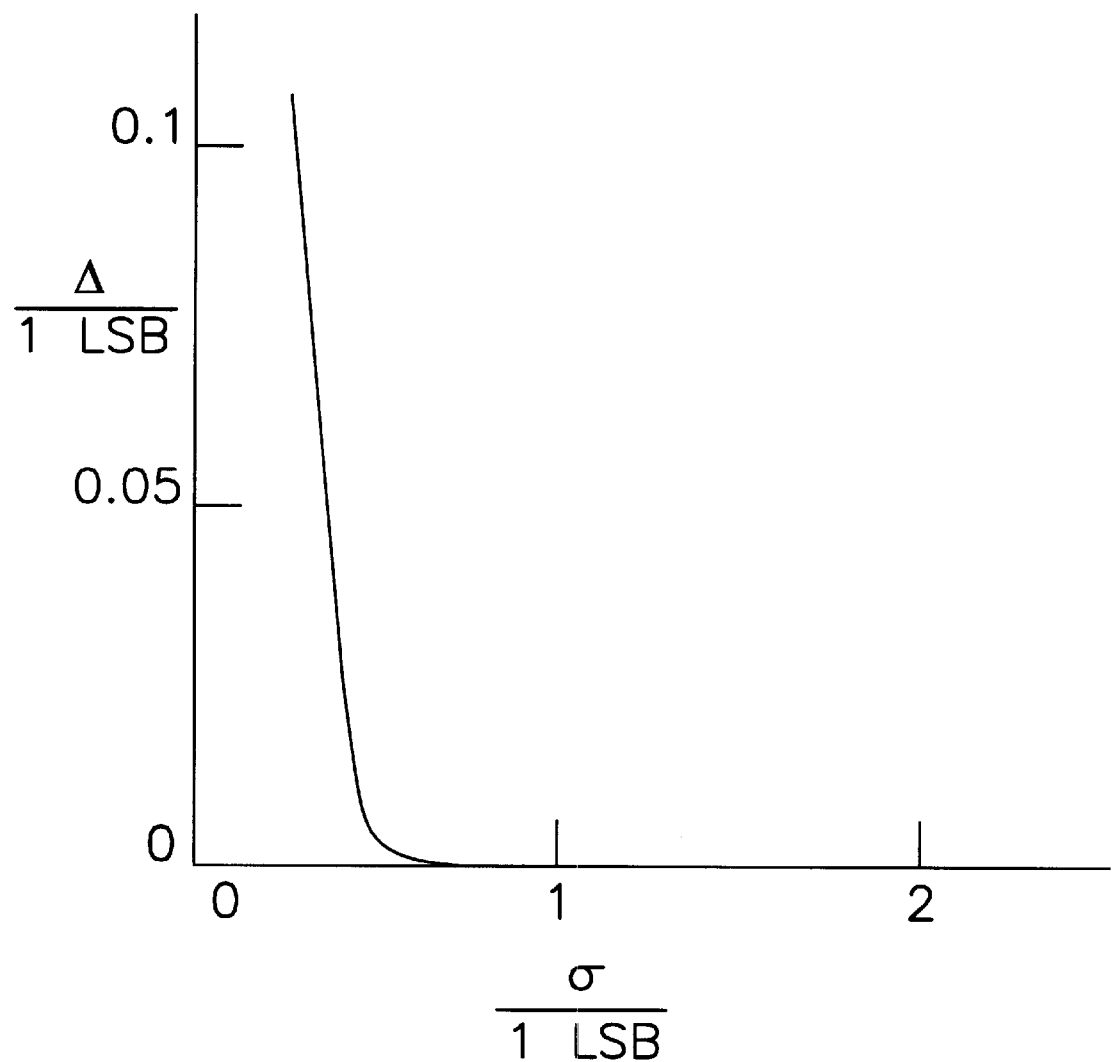
FIG. 6 illustrates Δ, the maximum systematic error in measuring the input voltage, as a function of σ, the rms amplitude of the white Gaussian noise added to the signal, both variables being plotted as a ratio to the width of 1 least-significant-bit (LSB) in the ADC, the error being negligible for σ>0.6 LSB.
Figure 7:
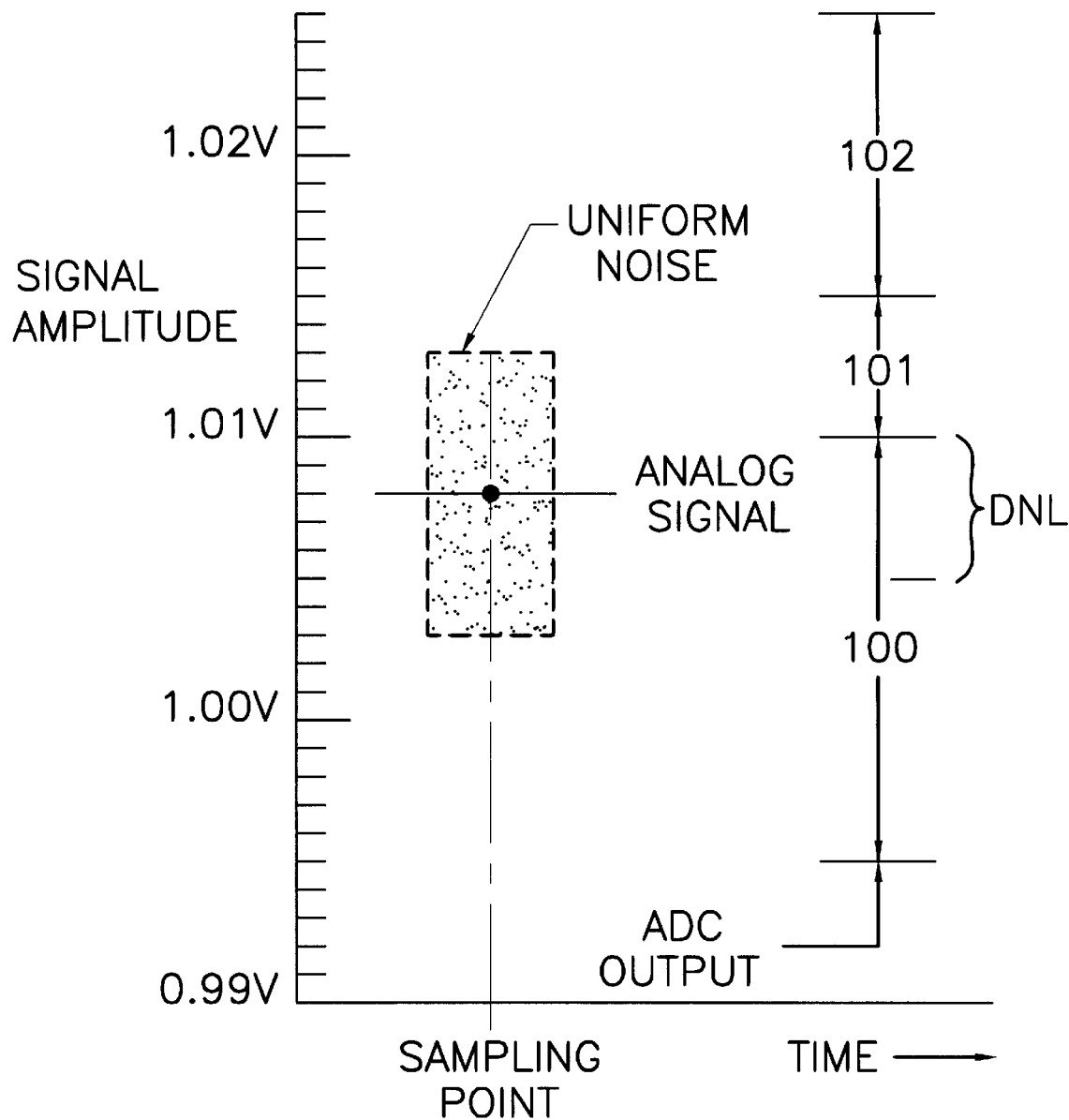
FIG. 7 illustrates the systematic error caused by differential non-linearity in the ADC.
Figure 9:
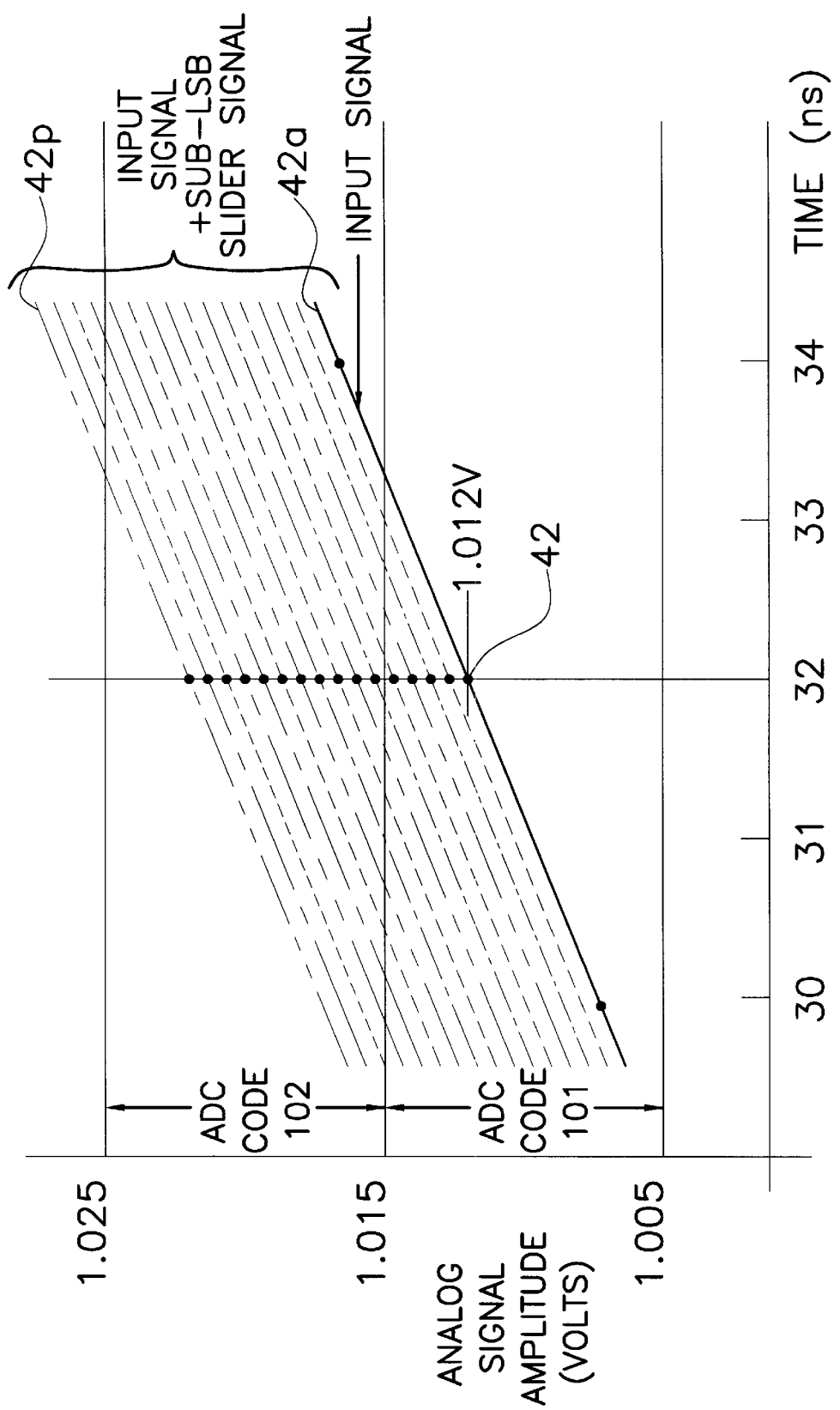
FIG. 9 is an expanded view of FIG. 1 in the region around the sample at 32 ns, the sloping solid line representing the input signal to the DSA, having a voltage of 1.012 volts at the 32 ns sampling point, the dashed lines representing the offsets of the input signal produced by the SLSB slider.

The signal produced by the slider offset circuit 10 is illustrated in FIG. 9. FIG. 9 shows an expansion of the region in the vicinity of 32 nanoseconds of the sample of FIG. 1 including the offsets generated by the SLSB slider 22. The base analog signal 42 is illustrated as a solid line having a value of 1.012 volts at 32 nanoseconds. Each broken line represents the base analog signal 42 summed with an incremental offset in voltage generated by the SLSB slider 22. The incremental offset comprises a small fraction of one least-significant-bit of the ADC 28. In the illustrated embodiment, the incremental offset is $\frac{1}{16}$ of one LSB of the ADC 28 such that the offset is zero during the first record 42a, $\frac{1}{16}$ of one LSB during the second record 4b, $\frac{2}{16}$ of one LSB during the third record 42c, and so on up to $\frac{15}{16}$ of one LSB during the sixteenth record 42p. On the seventeenth record, the incremental offset returns to zero and the cycle repeats.

Because the offset voltage only changes at the end of a record, ample time is available to provide the stable, low-noise offset required. Furthermore, because the amount of the analog offset voltage to be added at the input is predetermined, the digital representation of that offset is known and can be subtracted from the output of the ADC 28.

Accordingly, the SLSB slider 22 provides an increasingly accurate output from the ADC 28 as more data is averaged. Further, the result will be obtained in significantly fewer samples than with prior art devices. For example, assume sixteen samples are taken at 32 nanoseconds with the special case eight-bit ADC having zero differential non-linearity (DNL) discussed previously. With each sample, the offset generated by the SLSB slider 22 increments by $\frac{1}{16}$ LSB, or 0.625 mV. For these sixteen records, the ADC 28 returns the 101 code five times and the 102 code eleven times. Dividing the ADC 28 codes by 100 to represent the input voltage, the average value recorded for the voltage is:

$$\frac{\frac{5\times 101}{100} + \frac{11\times 102}{100}}{16} = 1.10169 \text{ volts} \tag{5}$$

The result of Equation 5 must be corrected to account for the average offset added by the SLSB slider 22. This offset is computed as:

$$0.625 \text{ mV} \times \frac{(0+1+2+3+\ldots+14+15)}{16} = 4.69 \text{ mV} \tag{6}$$

The final result is obtained by subtracting the average offset of Equation 6 from the average recorded value of Equation 5:

$$1.0169 - 0.00469 = 1.0122 \text{ volts} \tag{7}$$

The result is 0.2 mV of the correct value. Accordingly, by increasing the measurement time by a factor of 16, the resolution of the circuit has been improved by a factor of 16. One skilled in the art will recognize that a precision $\leq \frac{1}{16}$ LSB is achieved in 16 records with the SLSB slider 22, whereas the prior art method requires 1024 records to achieve the same precision. Thus, the present invention enhances speed by a factor of 64 over the prior art. Of course, the time resolution of the SLSB slider method is still the sampling interval of the ADC 28 used, so fast waveforms are recorded with the same time resolution.

The SLSB circuit assumes that the voltage bin width for each LSB is uniform over the full range of the ADC 28 to better than $\frac{1}{16}$ LSB. One skilled in the art will recognize that a typical DNL value for a conventional ADC 28 is $\pm\frac{1}{2}$ LSB. Thus, the effective differential non-linearity of a conventional ADC 28 must be reduced to less than $\pm\frac{1}{16}$ LSB in order for the SLSB slider 22 to provide interpolation that has an accuracy of $\pm\frac{1}{16}$ LSB. In the illustrated embodiment, a Gatti slider 24 is employed to correct for the DNL error. The offset on the first record would be zero. On the second record the offset becomes one average bin width. The offset increases by one average bin width up to some maximum, for example 15. One skilled in the art will recognize that any number of offsets could be used so long as the number of offsets lowers the effective DNL to a level required by the SLSB slider 22. The Gatti slider offset is then reset to zero and the cycle is repeated. By "sliding" a given measurement over several adjacent bins, the DNL becomes the average of the DNL of those bins. For example, by using 16 offsets for the Gatti slider 24, the DNL is reduced from $\pm\frac{1}{2}$ LSB to approximately $\pm\frac{1}{32}$ LSB.

It will be understood that, though possible, it may not be practical to make the increment for the Gatti slider 24 exactly equal to 1 LSB of the ADC 28 over the entire range of the ADC 28 because of the DNL inherent in the ADC 28. However, this fact does not impede the improvement gained from using the Gatti slider 24, provided the range of the Gatti slider 24 is large compared to 1 LSB of the ADC 28.

In the present invention, the Gatti slider 24 is combined with the SLSB slider 22. The digital representation of the analog offset added by both sliders at the ADC input can be subtracted either at the ADC output or from the data recorded in memory. The number of scans required in this invention for the optimum improvement in the example given becomes 16 (for the Gatti slider 24) times 16 (for the SLSB slider 22), for a total of 256 scans. This can be compared to the 29,860 scans required for the prior art noise-adding solution. Accordingly, the present invention converges to a precision and accuracy less than $\frac{1}{16}$ LSB approximately 116 times faster than is possible with the noise-adding prior art.

One skilled in the art will recognize that the increments chosen for the offsets in the examples above are not intended to limit the present invention. For example, the sequence of offsets need not be consecutive. Any sequence which covers each value of the set of offsets will give the same result. A sixteen number sequence, 0, 7, 14, 3, 10, 6, 13, 2, 9, 5, 12, 1, 8, 15, 4, 11, achieves the same result and produces smaller errors than a linearly increasing sequence when executing a number of records which is not a multiple of sixteen. Furthermore, a pseudo-random sequence of numbers could be used.

When interlacing the increments of the Gatti slider 24 and the SLSB slider 22, a sequence of numbers can be selected that optimizes the accuracy when the number of records is less than 256. For example, consider a slider implementation using an eight-bit DAC that combines the SLSB slider 22 and the Gatti slider 24, with the SLSB slider 22 occupying the four least-significant-bits and the Gatti slider 24 occupying the four most significant bits. The four least-significant-bits of the DAC span one LSB of the ADC 28 with sixteen (16) codes to implement the SLSB slider function. When the clock and control 32 adds 16 to the digital offset, the incremental offset generated by the DAC adds one LSB in the ADC 28, thus achieving the Gatti slider function. Incrementing the DAC by seven at the end of each record generates the following sequence of numbers in the DAC:

0, 7, 14, 21, 28, . . . , 238, 245, 252;
3, 10, 17, 24, 31, . . . , 241, 248, 255;
6, 13, 20, 27, 34, . . . , 237, 244, 251;
2, 9, 16, 23, 30, . . . , 240, 247, 254;
5, 12, 19, 26, 33, . . . , 236, 243, 250;
1, 8, 15, 22, 29, . . . , 239, 246, 253;
4, 11, 18, 25, 32, . . . , 235, 242, 249.

In the first row of numbers, the SLSB slider 22 is interpolating to 7/16 of one ADC bin while the Gatti slider 24 moves through 16 ADC bins. In successive rows the SLSB slider 24 fills in finer interpolation until it has interpolated to 1/16 of one ADC bin at the end of the entire sequence of numbers. Compared to incrementing the DAC by one at the end of each record, incrementing by seven improves the precision and accuracy of the DSA more quickly when the number of records is less than 256. Other sequences of numbers can be used to achieve the same result, including, but not limited to, a pseudo-random sequence of numbers. Of course, the present invention may be used with increments other than 16 in each slider.

An object of the present invention is to combine the slider offset circuit including the SLSB slider and Gatti slider to produce a high-performance DSA having improved speed in achieving sub-LSB accuracy and precision with no loss in time resolution. Because the proposed device relies on averaging the results of many measurements, it is particularly suited to measurements that require averaging for other reasons, for example, time-of flight mass spectroscopy.

The present invention provides improved performance when the inherent noise in the analog signal being measured spans less than 1 LSB in the ADC. The present invention also delivers improved performance in accurately measuring the baseline between pulses for cases where the analog signal consists of sparse pulses of low amplitude superimposed on a baseline voltage that exhibits negligible noise. The fast interpolation of this baseline voltage to an accuracy much less than 1 LSB is critical to an accurate measurement of the amplitudes of the sparse pulses. In such an application this invention makes the 8-bit ADC used in the example deliver the digital resolution of a 12-bit ADC after the average of 256 or more records.

If there is a need for even higher resolution, the step size of the SLSB slider is reduced and the span of the Gatti slider is expanded. Reducing the step size of the SLSB slider is not necessary, however, when the inherent noise in the waveform supplied to the input of the Digital Signal Averager is larger than 1/16 LSB (0.625 mV in the examples above). Alternatively, white Gaussian noise with an rms amplitude of the order of 1/16 LSB can be added to the signal via an additional input to summing amplifier 26. All of these solutions to achieve even better accuracy will require a larger number of records.

Having disclosed an apparatus for improving the resolution of a conventional analog-to-digital converter, it is instructional to describe a method for using the apparatus. Accordingly, the method for improving the resolution and rate of convergence of a conventional ADC includes repetitively sampling a repeatable analog signal to collect an ensemble of discrete points distributed in time which are digitized and then averaged to form a digital representation of the analog signal with improved amplitude resolution.

To improve the resolution of the ADC, two analog offsets are generated. The first analog offset for implementing the SLSB slider is formed from a first set of numbers. Each member of the first set of numbers represents one of a series of integers having a constant interval and the entire set of numbers spans a range corresponding to a voltage range approximately equal to an average voltage of one least-significant-bit of an analog-to-digital converter. The first set of numbers describes a series having an incremental sequence, a decremental sequence, or a pseudo-random sequence. Similarly, the second analog offset implementing a Gatti slider is formed from a second set of numbers. This second set of numbers defines a series of integers having a minimum interval corresponding to a voltage range approximately equal to the average voltage of one least-significant-bit of the ADC. The interval need not be constant and may vary by an integer multiple. Likewise, the second set of numbers describes a series having an incremental sequence, a decremental sequence, or a pseudo-random sequence.

Once the number sets have been generated, a combination including one of the first set of numbers and one of the second set of numbers is selected for use during the current record. No combination is repeated until every possible combination has been selected. A first analog voltage offset corresponding to the selected number from the first set of numbers is generated and a second analog voltage offset corresponding to the selected number from the second set of numbers is generated. The analog voltage offsets are summed with the repeatable analog signal to form a summed signal. Beginning with a trigger which represents the start of the repeatable analog signal, the summed signal is digitized a predetermined number of times at a constant time interval. The collection of these digitizations forms a record. The digital numbers collected at each acquisition time are averaged to form averaged data points and stored.

Finally, the digital representations of the analog voltage offsets are removed from the stored data points to restore the data. One method for subtracting the first and second analog voltage offsets is to subtract each number from the currently selected combination from each discrete digital data point prior to averaging. Alternatively, the average of the members from each set of numbers selected for the combination is subtracted from each averaged data point. The averaged data points may optionally be conditioned by a digital signal processor prior to storage of the restored data. The method is repeated until a specified number of said records have been acquired.

From the foregoing description, it will be recognized by those skilled in the art that a high performance digital signal averager with distinctly improved performance over prior art and method for use has been provided. Specifically, the known limitations of high-speed analog-to-digital converters have been compensated in a unique way, yielding an instrument with an improved speed of convergence to sub-least-significant-bit accuracy and precision.

While a preferred embodiment has been shown and described, it will be understood that it is not intended to limit the disclosure, but rather the present disclosure and the appended claims are intended to cover all modifications and alternate methods falling within the spirit and the scope of the invention as defined in the appended claims.

Having thus described the aforementioned invention, we claim:

1. A method for improving the resolution and rate of convergence of a conventional analog-to-digital converter where an ensemble of discrete points distributed in time over a repeatable analog signal is sampled repetitively and digitized upon each repetition into an ensemble of digital data points, each point of the ensemble of digital data points being averaged with the other repeated samples of that data point to form a digital representation of the analog signal with improved amplitude resolution, said method comprising the steps of:

(a) generating a first set of numbers representing a sub-least-significant-bit offset, said first set of numbers defining a first numeric series having a constant interval, said first set of numbers spanning a range that corresponds to a voltage range approximately equal to an average voltage of one least-significant-bit of an analog-to-digital converter;

(b) generating a second set of numbers representing a Gatti offset, said second set of numbers defining a second numeric series whose minimum interval corresponds to a voltage range approximately equal to one average voltage of one least-significant-bit of the analog-to-digital converter;

(c) selecting a combination consisting of a first member being one of said first set of numbers and a second member being one of said second set of numbers for use during a current record, said combination not being repeated until every possible combination is selected;

(d) adding an analog offset representing said combination to the repeatable analog signal;

(e) sampling said summed signal as a sampled voltage at a predetermined number of discrete temporal points, said temporal points spanning the repeatable analog signal, said discrete sampled voltage having an amplitude;

(f) digitizing each said sampled voltage as a digital number representing the amplitude of said sampled voltage, a plurality of said digital numbers forming a record;

(g) averaging each said digital number sampled at a particular temporal point within the current record with each said digital number acquired at the particular temporal point within all previous records to form a plurality of averaged data points; and (h) repeating said step of selecting a combination through said step of averaging each said digital number until a specified number of records have been acquired.

2. The method of claim 1, in said step of generating a first set of numbers, wherein said first series is selected from a group consisting of an incremental sequence, a decremental sequence, and a pseudo-random sequence.

3. The method of claim 1, in said step of generating a second set of numbers, wherein said second series is selected from a group consisting of an incremental sequence, a decremental sequence, and a pseudo-random sequence.

4. The method of claim 1 further comprising the step of subtracting said combination from each said digital number.

5. The method of claim 4 wherein said step of subtracting said combination occurs prior to said step of averaging and includes subtracting said first member of said combination and said second member of said combination from each said digital number of the record.

6. The method of claim 4 wherein said step of subtracting said combination occurs after said step of averaging each said data point, said step of subtracting said combination further comprising the steps of:

(i) averaging each member of said first set of numbers selected for use in said combination to form a first average offset;

(ii) subtracting said first average offset from each of said plurality of averaged data points;

(iii) averaging each member of said second set of numbers selected for use in said combination to form a second average offset; and (iv) subtracting said second average offset from each of said plurality of averaged data points.

7. The method of claim 1, after said step of averaging each said digital number, further comprising the step of conditioning said plurality of averaged data points in a digital signal processor.

8. The method of claim 1 wherein said step of adding the analog offset further comprises the steps of:

(i) converting said first member of said combination into a first analog voltage offset;

(ii) converting said second member of said combination into a second analog voltage offset; and (iii) summing said first analog voltage offset and said second analog voltage offset with the repeatable analog signal to form a summed signal.

9. The method of claim 1 wherein said step of adding the analog offset further comprises the steps of:

(i) summing said first member of said combination and said second member of said combination digitally as a digital offset sum;

(ii) converting said digital offset sum to an analog voltage offset; and (iii) summing said analog voltage offset with the repeatable analog signal to form a summed signal.

10. The method of claim 1 wherein each element of said second numeric series is spaced from another by an interval, said interval being variable by an integer multiple of said minimum interval.

11. A circuit for improving the resolution of a conventional analog-to-digital converter, wherein said circuit receives an analog input signal from an analog sensor, said circuit including:

at least one digital-to-analog converter for generating an analog offset of a predetermined magnitude;

a summation device for summing said analog offset from each of said at least one digital-to-analog converter with an analog input signal to obtain a summed analog signal;

an analog-to-digital converter for digitizing said summed analog signal as offset digital signal data;

a control device for sequencing said at least one digital-to-analog converter, said summation device, and said analog-to-digital converter;

processing device for sequencing said control device; and at least one memory device responsive to said processing device for storing said offset digital signal data and said result data.

12. The circuit of claim 11 wherein said control device is synchronized with an analog signal from an analog sensor.

13. The circuit of claim 11 wherein said circuit includes a digital signal processor for conditioning said result data prior to sending said result data to an analysis and storage device.

14. The circuit of claim 11 wherein said circuit further comprises a subtraction device for subtracting a digital representation of said analog offset from said offset digital signal data to obtain result data, said subtraction device responsive to said control device.

* * * * *

UNITED STATES PATENT AND TRADEMARK OFFICE
CERTIFICATE OF CORRECTION

PATENT NO. : 6,028,543
DATED : February 22, 2000
INVENTOR(S) : Dale A. Gedcke, et al.

It is certified that error appears in the above-identified patent and that said Letters Patent is hereby corrected as shown below:

Column 5 at Line 5, please replace "±½" with --+½--.

Column 10 at Line 12, please insert --within-- prior to "0.2 mV".

Signed and Sealed this

Sixth Day of March, 2001

*Attest:*

NICHOLAS P. GODICI

*Attesting Officer*  *Acting Director of the United States Patent and Trademark Office*